United States Patent [19]

Aono

[11] Patent Number: 5,226,008
[45] Date of Patent: Jul. 6, 1993

[54] DYNAMIC RANDOM ACCESS MEMORY ALLOWING DETERMINATION OF A READ/WRITE CONTROL TYPE AT THE FINAL STEP OF MANUFACTURING PROCESS

[75] Inventor: Tetsuya Aono, Hyogo, Japan

[73] Assignee: Mitsubishi Denki Kabushiki Kaisha, Tokyo, Japan

[21] Appl. No.: 828,276

[22] Filed: Jan. 30, 1992

[30] Foreign Application Priority Data

May 16, 1991 [JP] Japan ................................ 3-111445

[51] Int. Cl.$^5$ .............................................. G11C 7/00
[52] U.S. Cl. .................................. 365/189.01; 365/63; 365/189.05
[58] Field of Search ...................... 365/233, 52, 63, 72, 365/230.03, 189.05, 189.01

[56] References Cited

U.S. PATENT DOCUMENTS 4,956,811  9/1990  Kajigaya et al. ............... 365/189.01
5,018,101  5/1991  Kajigaya et al. ............... 365/189.01

Primary Examiner—Eugene R. LaRoche
Assistant Examiner—Andrew Tran
Attorney, Agent, or Firm—Lowe, Price, LeBlanc & Becker

[57] ABSTRACT

There is disclosed a DRAM having a 16 bit configuration which can be used for either a 2CAS/1WE type or a 1CAS/2WE type. The type of DRAM to be used is determined by whether there is a connection through a gold wire between a predetermined bonding pad and a lead for ground potential. Depending on the state of the connection of the bounding pad, conversion buffer converts externally applied control clock signals to internal control clock signals for either the 2CAS/1WE or the 1CAS/2WE. A clock generator not shown is operated in response to the converted internal control clock signals. The type of DRAM to be used is determined by whether there is a connection through a gold wire which is provided at the final step in a manufacturing process, so that the manufacturing processes are unified and therefore the type of DRAM to be used can be altered quickly depending on a drastically changing demand. In addition, efficiency in manufacturing a DRAM is enhanced.

6 Claims, 13 Drawing Sheets

DYNAMIC RANDOM ACCESS MEMORY ALLOWING DETERMINATION OF A READ/WRITE CONTROL TYPE AT THE FINAL STEP OF MANUFACTURING PROCESS

BACKGROUND OF THE INVENTION

1. Field of the Invention

This invention relates generally to dynamic random access memory devices (DRAMs), and more particularly, to a dynamic random access memory device allowing data to be read and to be written in a byte-by-byte basis and having a multibit configuration.

2. Description of the Background Art

A memory board for storing data in a computer system generally comprises a number of semiconductor memory devices. A number of semiconductor memories such as dynamic random access memories and static random access memories are mounted on the memory board, and these are connected through a great deal of wiring. In order to reduce the wiring on the memory board and power consumption, generally, the number of semiconductor memories mounted on the board needs to be decreased. It is desirable, therefore, to maintain necessary storage capacity and decrease the number of semiconductor memories on the memory board. It should be pointed out that in simplifying the control of semiconductor memories, it is also desirable to decrease the number of semiconductor memories.

FIG. 9 is a block diagram of a memory system (or a memory board) used for a personal computer as one example. Referring to FIG. 9, this memory system comprises dynamic random access memories (hereinafter referred to as a "DRAM") 201 and 202 each having an 8-bit configuration. An address decoder 203 decodes an address signal on an address bus in response to a memory request signal applied from a CPU. A RAM request signal determined by this decoding is applied to a timing controller 206. A refresh timer 204 generates a refresh request signal, and supplies it to timing controller 206. Timing controller 206 operates also in response to a read command and a write command from the CPU. Timing controller 206 applies a control signal to a control signal driver 208 in response to an applied control signal. Control signal driver 208 generates various clock signals /RAS, /CAS0 and CAS1, /WE and /OE necessary to operate DRAMs 201 and 202. A refresh address counter 205 generates a refresh address signal in response to a signal /REFAE generated from timing controller 206. An address multiplexer 207 accepts this refresh address signal and an address signal on the address bus, and applies multiplexed address signals MA0 through MA9 to two DRAMs 201 and 202. Data buffers 209 and 210 are connected to the CPU through a 16-bit data bus 211. Data buffer 209 processes the lower byte of data bits D1 through D8 in data of 2 bytes (16 bits). Data buffer 210 processes the higher byte of data bits D9 through D16. Data buffers 209 and 210 are connected to DRAMs 201 and 202, respectively. Therefore, DRAM201 stores a lower byte of data D1 through D8, and DRAM 202 stores a higher byte of data D9 through D16.

Conventionally, DRAMs 201 and 202 used in the computer system shown in FIG. 9 process data on a byte-by-byte basis, because a DRAM having a 8-bit configuration is on the market. In recent years, a DRAM 200 having a 16-bit configuration has come onto the market, so that it is possible to use one DRAM 200 in place of two DRAMs 201 and 202. As a result, the number of DRAMs used in the computer system has reduced, and therefore reduction and simplification in the wiring and reduction of power consumption in a memory system or a memory board have been achieved.

As a DRAM having a 16-bit configuration, the following types have been conventionally known. The first type DRAM allows reading and writing in response to two column address strobe (hereinafter referred to as "CAS") signals and one write enable (hereinafter referred to as "WE") signal. This type of DRAM will be referred to as a 2 CAS/1WE type hereinafter. The second type of DRAM allows reading and writing in response to one CAS signal and two WE signals. This type will be referred to as a 1CAS/2WE type hereinafter. Since DRAM 200 shown in FIG. 9 is operated in response to two signals /CAS 0 and /CAS 1, and one signal /WE, it is a 2 CAS/1WE type. In addition, the third type of DRAM allows reading and writing in response to one CAS signal and one WE signal. This type of DRAM will be referred to as a 1CAS/1WE type hereinafter.

When a DRAM has a 16 bit configuration, a DRAM of a 1CAS/1WE type allows reading and writing of data on a 2-byte-by-2-byte basis, that is, on a 16-bit-by-16-bit basis. A DRAM of 1CAS/2WE type allows reading of data on a 2-byte-by-2-byte basis, that is on a 16-bit-by-16-bit basis, and writing of data on a higher-byte-by-higher-byte or a lower-byte-by-lower-byte basis (an 8-bit-by-8-bit basis). A DRAM of 2CAS/1WE type processes data on a higher-byte-by-higher-byte or lower-byte-by-lower-byte basis (that is, an 8-bit-by-8-bit basis) in reading and writing.

FIGS. 10 through 13 are timing charts in a typical operation cycle of a DRAM of the aforementioned type. FIG. 10 shows operation in a higher byte reading cycle of a DRAM of a 2CAS/1WE type. This DRAM is operated in response to a signal /LCAS for a higher byte and a signal LCAS and a signal /WE for a lower byte. A signal /RAS falls after a signal /UCAS rises, so that a row address signal RA for designating data in a higher byte is accepted. A column address signal CA is also accepted in response to the fall of a signal /UCAS. At that time, a signal /WE maintains a high level, so that a reading operation is performed. In response to the fall of a signal /OE, readout data bits DQ9 through DQ16 in a higher byte are output.

Referring to FIG. 11, a higher byte write cycle in a DRAM of a 2CAS/1WE type is shown. In this case, column address signal for designating a memory cell in which data bits DQ9 through DQ16 in a higher byte are to be stored is accepted and data DQ9 through DQ16 are written in the designated memory cell.

Referring to FIG. 12, a reading cycle in a DRAM of a 1CAS/2WE type is shown. This DRAM is operated in response to a signal /CAS, a signal /UWE for a higher byte and a signal /LWE for a lower byte.

Referring to FIG. 13, operation of a lower byte write cycle in a DRAM of 1CAS/2WE type is shown.

A DRAM of a 2CAS/1WE type is often used, for example, in a memory system such as a personal computer shown in FIG. 9. The reason is that generally data is frequently processed on a byte-by-byte basis in a computer system. Therefore, the DRAM of a 2CAS/1WE type allowing reading and writing of data on a byte-by-byte basis, that is, on a 8-bit-by 8-bit basis is used. On the other hand, reading data on a byte-by-byte basis is not normally necessary in the field of image processing. In the field of image processing, data needs to be written in a DRAM on a byte-by-byte basis, but in a reading operation, data is normally processed on a word-by-word basis (that is, 2 byte) or on a 2-word-by-2-word basis. In such a field, therefore, a DRAM of a 1CAS/2WE type is used.

FIG. 14 is a circuit diagram of an input buffer circuit for a DRAM of a 2CAS/1WE type. Referring to FIG. 14, externally supplied signals /UCAS, /LCAS and /WE are supplied to bounding pads 31 through 33 provided on a semiconductor chip through gold wires 41 through 43, respectively. An input buffer circuit 2 for a 2CAS/1WE type is connected to receive the signals applied to bounding pads 31 through 33, and therefore input buffer circuit 2 outputs internal signals /UCAS, /LCAS and /WE and supplies them to a clock generator not shown.

FIG. 15 is a circuit diagram of an input buffer circuit for a DRAM of a 1CAS/2WE type. Similar to the one shown in FIG. 14, an input buffer circuit 3 for a 1CAS/2WE type is connected to receive externally applied signals CAS, /UWE and /LWE. This input buffer circuit 3 outputs internal signals /CAS, /UWE and /LWE and applies them to a clock generator not shown.

Input buffer circuits 2 and 3 shown in FIGS. 14 and 15 are similar to each other, but it should be pointed out that these are peculiar to DRAMs of 2CAS/1WE type and a 1CAS/2WE type, respectively. In other words, input buffer circuit 2 shown in FIG. 14 cannot be used as an input buffer circuit for a DRAM of a 1CAS/2WE type. An input buffer circuit 3 shown in FIG. 15 cannot be used as an input buffer circuit for a DRAM of a 2CAS/1WE type. In a manufacturing factory, therefore, it is necessary to produce two kinds of DRAM in which almost all circuit configurations are the same but only input buffer circuits are different from each other. Similar mask patterns which are different only in circuit patterns for the input buffer circuits have been prepared, and two kinds of production line composed of almost the same manufacturing process have been necessary. This brings about a decline of efficiency such as design efficiency, production efficiency and test efficiency in a semiconductor manufacturing factory. In addition to that, it should be also pointed out that drastically changing demand can not be readily met because the use of DRAMs to be manufactured is determined in an early stage of manufacturing.

SUMMARY OF THE INVENTION

One object of the invention is to enhance efficiency in manufacturing DRAMs.

Another object of the invention is to quickly alter the type of DRAM to be manufactured depending on drastically changing demand of DRAMs.

A dynamic random access memory device according to the invention can be used either as a first read/write control type controlled by a first and a second column address strobe signals and a single write enable signal, or as a second read/write control type controlled by a single column address strobe signal and a first and a second write enable signals. This memory device comprises a semiconductor substrate, a power supply input lead receiving an externally supplied power supply voltage, a predetermined bounding pad formed on the substrate, a signal converting circuit converting at least three externally applied control signals to internal control signals for either a first or a second read/write control type in response to a potential of the predetermined bounding pad, and a clock signal generator generating a clock signal for operating the memory device either as a first or as a second read/write control type in response to the internal control signals. The potential of the predetermined bounding pad is determined by whether there is a connection between the power supply input lead and the predetermined bounding pad.

In operation, signal converting circuit converts the externally applied control signals to the internal control signals used in either a first or a second read/write control type in response to the potential of the predetermined bounding pad. Because selection of the above mentioned two control types can be determined by whether there is a connection between the power supply input lead and the predetermined bounding pad, a dynamic random access memory device of the above mentioned types can be determined to be either of them in a final stage of the manufacturing process. Therefore efficiency in manufacturing can be enhanced, and a quick alteration can be achieved in manufacturing depending on drastically changing demand.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
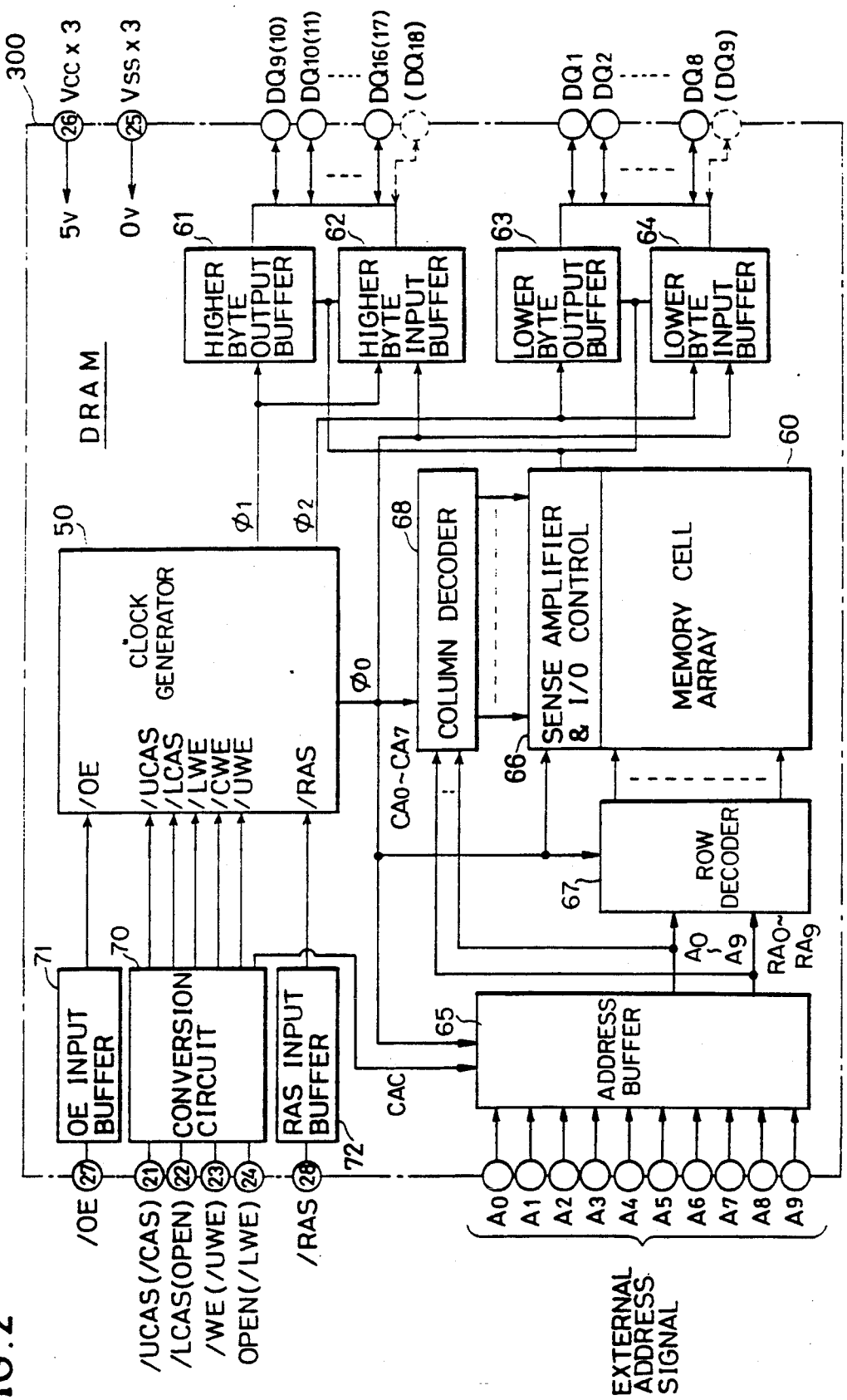
FIG. 2 is a block diagram of a DRAM showing one embodiment of the invention.

FIG. 2 is a block diagram of a DRAM having a 16-bit configuration showing one embodiment of this invention. Referring to FIG. 2, a DRAM 300 comprises a memory cell array 60 including memory cells for storing 4-megabit data, an address buffer 65 for receiving externally applied external address signals A0 through A9, a row decoder 67 decoding row address signals RA0 through RA9, a column decoder 68 decoding column address signals CA0 through CA7, and a sense amplifier and I/O control circuit amplifying a data signal read from a memory cell. An I/O control signal is applied to an output buffer for a higher byte 61 and a buffer for a lower byte 63. Memory cell array 60 is connected to an input buffer for a higher byte 62 and an input buffer for a lower byte 64. Output buffer 61 and input buffer 62 for a higher byte are connected to leads for a higher byte of data bits DQ9 through DQ16. Output buffer 63 and input buffer 64 for a lower byte are connected to leads for a lower byte of data bits DQ1 through DQ8. If this DRAM 300 has a parity bit for each byte, two leads for two parity bits DQ9 and DQ18 are added. These input/output buffers 61 through 64 are operated in response to control signals generated from a clock generator 50.

Clock generator 50 generates various control clock signals $\phi 0$, $\phi 1$, $\phi 2$, etc. necessary to control this DRAM 300. An OE input buffer 71 receives an externally applied output enable signal /OE, and applies it to clock generator 50. Similarly, a RAS input buffer 72 receives an externally applied row address strobe signal /RAS, and applies it to clock generator 50.

A conversion circuit 70 is connected to receive either an external control clock signal for a 2CAS/1WE type or an external control clock signal for a 1CAS/2WE type. That is, in a case where DRAM 300 is used as a former type, signals /UCAS, /LCAS and /WE are applied to conversion circuit 70 through leads 21, 22 and 23. On the other hand, in a case where DRAM 300 is used as a latter type, signals /CAS, /UWE and /LWE are applied to conversion circuit 70 through leads 21, 23 and 24. Conversion circuit 70 generates some of internal control clock signals /UCAS, /LCAS, /LWE, /CWE, /UWE and CAC selectively depending on the operations described below.

Figure 3:
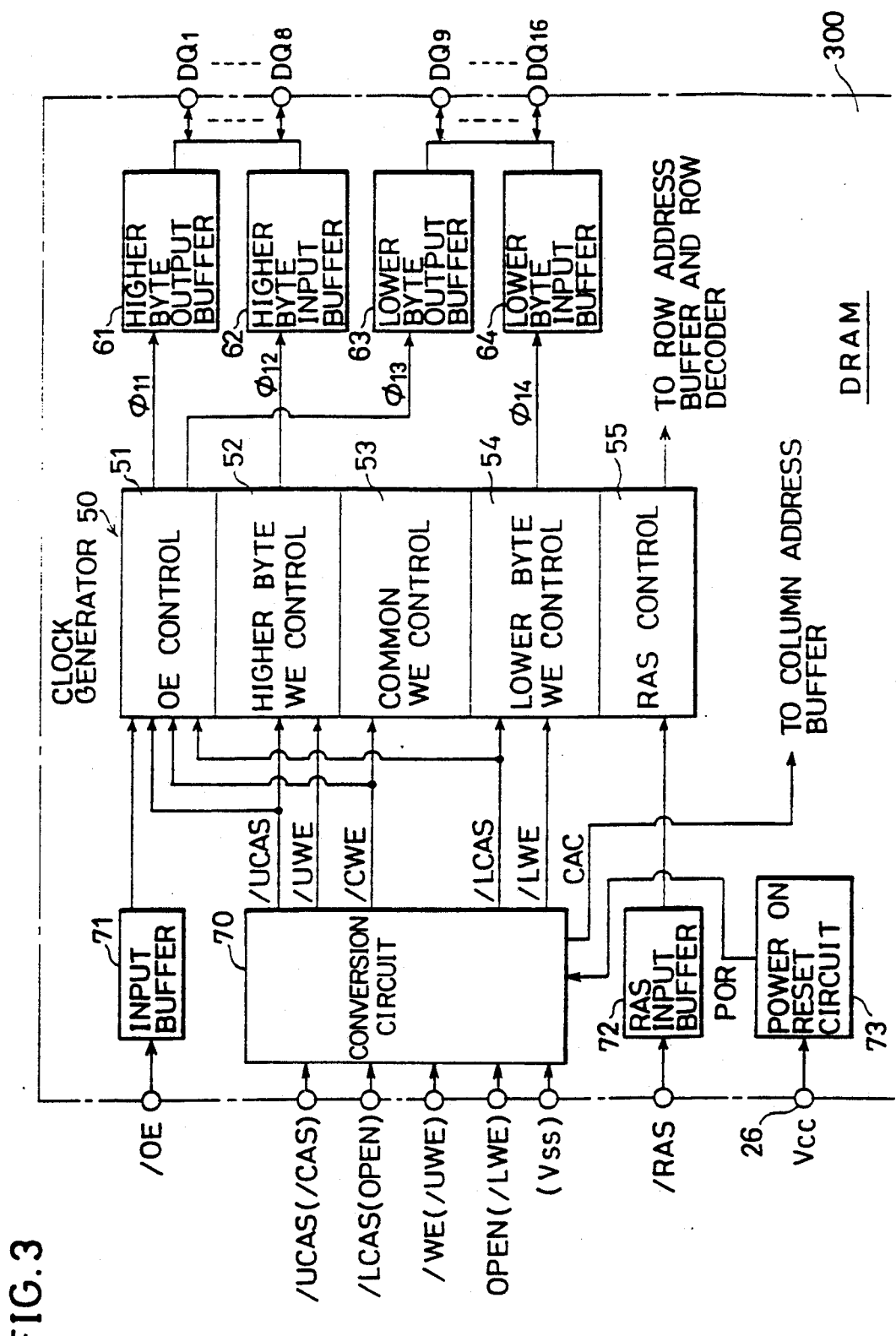
FIG. 3 is a block diagram of a clock generator and its peripheral circuit shown in FIG. 2.

FIG. 3 is a block diagram of clock generator 50 shown in FIG. 2 and its peripheral circuit. Referring to FIG. 3, clock generator 50 comprises an output enable (OE) control circuit 51, a write enable (WE) control circuit for higher byte 52, a commonly used write enable control circuit 53, a write enable control circuit for a lower byte 54, and a row address strobe (RAS) control circuit 55. A control circuit 51 supplies output enable control signals $\phi 11$ and $\phi 13$ to an output buffer for a higher byte 61 and an output buffer for a lower byte 63, respectively. A control circuit 52 supplies a write enable signal for higher byte $\phi 12$ to an input buffer for a higher byte 62. A control circuit 54 supplies a write enable signal for a lower byte $\phi 14$ to an input buffer for a lower byte 64. A control circuit 55 supplies a control signal for a row address strobe to a row address buffer and a row decoder not shown.

Control circuit 51 is connected to receive a signal /OE output from an input buffer 71 and signals /CAS, /CWE and /LCAS output from conversion circuit 70. Control circuit 52 is connected to receive signals /UCAS and /UWE output from conversion circuit 70. Conversion circuit 54 is connected to signals /LCAS and /LWE output from conversion circuit 70. A column address control signal CAC output from conversion circuit 70 is applied to a column address buffer not shown. Conversion circuit 70 is connected to receive a power on reset signal POR generated from a power on reset circuit 73. Power on reset circuit 73 is connected to a lead 26 for receiving an externally supplied power supply voltage Vcc.

Figure 1:
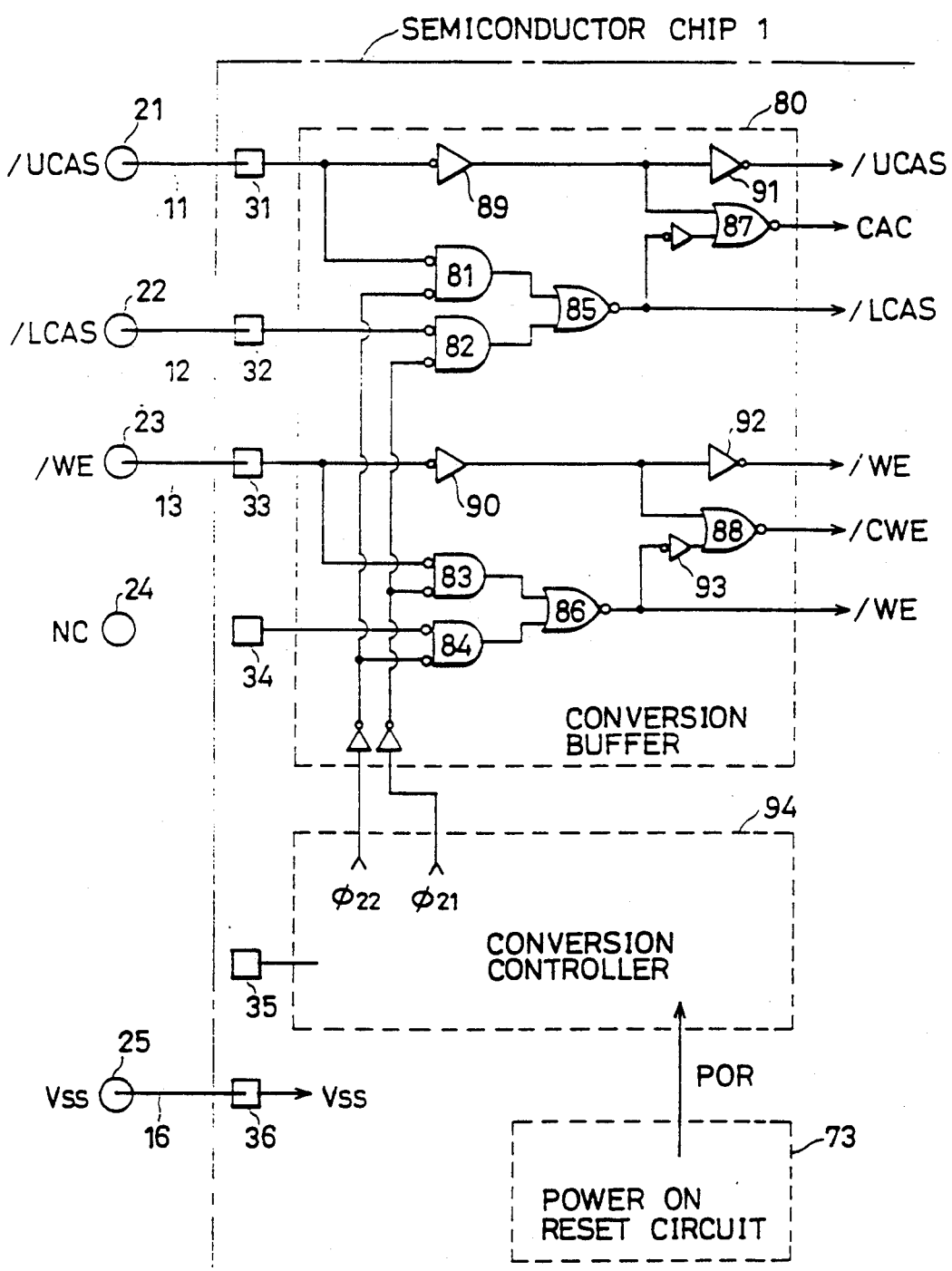
FIG. 1 is a circuit diagram of a conversion buffer provided in a conversion circuit shown in FIGS. 2 and 3.

FIG. 1 is a circuit diagram of a conversion buffer 80 provided in conversion circuit 70 shown in FIGS. 2 and 3. Conversion circuit 70 comprises this conversion buffer 80 and a conversion controller 94. Referring to FIG. 1, conversion buffer 80 comprises NOR gates 81 through 88 and inverters 89 through 93. Conversion buffer 80 is controlled in response to conversion control signals $\phi 21$ and $\phi 22$ generated from conversion controller 94. Conversion controller 94 receives a signal POR generated from power on reset circuit 73.

Bonding pads 31 through 36 are formed on a semiconductor chip 1. Bonding pads 31 through 34 are connected to inputs of conversion buffer 80. Bonding pad 35 is connected to an input of conversion controller 94. Bonding pads 31 through 33 are connected to leads for external control clock signal inputs 21 through 23 by way of gold wires 11 through 13, respectively. FIG. 1 shows a case where DRAM 300 shown in FIG. 2 is used as a 2CAS/1WE type, and therefore signals /UCAS, /LCAS and /WE are applied to leads 21, 22 and 23, respectively. Lead 24 and bonding pad 34 are not connected through a gold wire. Lead 25 and bonding pad 35 are also not connected through a gold wire. Bonding pad 35 is, therefore, brought into a floating state.

Figure 4:
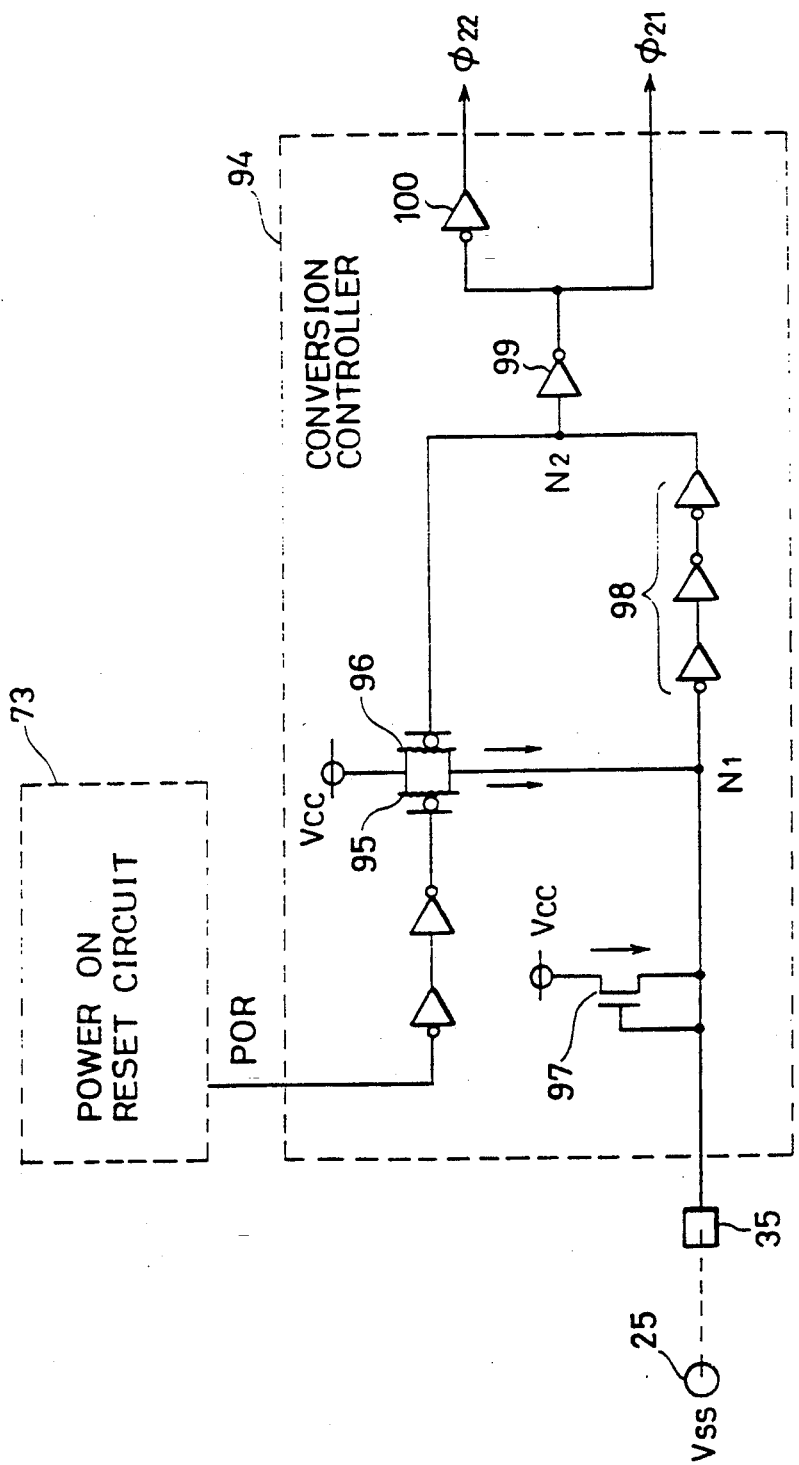
FIG. 4 is a circuit diagram of a conversion controller shown in FIG. 1.

FIG. 4 is a circuit diagram of conversion controller 94 shown in FIG. 1. Referring to FIG. 4, this conversion controller 94 comprises PMOS transistors 95 and 96 connected in parallel between a power supply Vcc and a node N1, an NMOS transistor 97 connected between power supply Vcc and node N1, and three inverters 98, 99, 100 cascaded between node N1 and the gate of transistor 96. Node N1 is connected to bonding pad 35. Transistor 95 has the gate connected to receive a power on reset signal POR generated from power on reset circuit 73.

Figure 5:
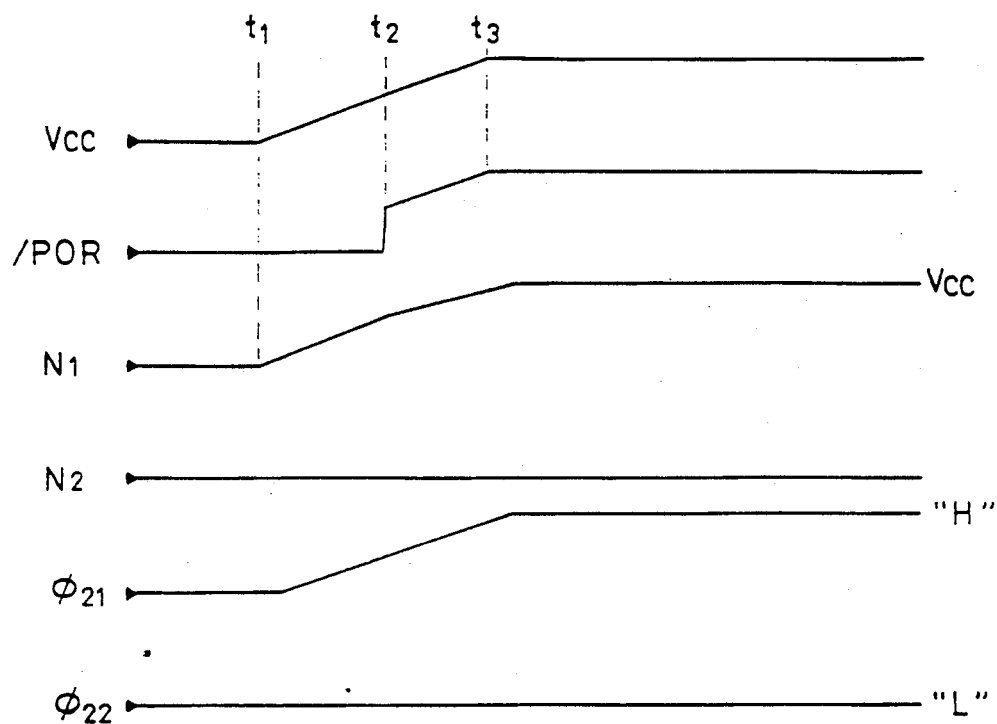
FIG. 5 is a timing chart showing an operation of the conversion controller shown in FIG. 4.

The operation will now be described. FIG. 5 is a timing chart of conversion controller 94 shown in FIG. 4 in a case where DRAM 300 shown in FIG. 2 is used as a 2CAS/1WE type. In this case, bonding pad 35 is open. At a time t1, power supply Vcc starts to be supplied. Until a time t2 a low level signal /POR is applied, so that transistor 95 is turned on. Node N1, therefore, is charged with a rise of the power supply voltage. When the potential of node N1 rises, the potential of node N2 falls by three inverters 98. Transistor 96 is, therefore, turned on, and charge of node N1 is further accelerated. When a signal /POR attains a high level at time t2, transistor 95 is turned off, but transistor 96 is held on. When the potential of node N1 rises, transistor 97 is turned on. Therefore, node N1 is held at a high level by transistors 96 and 97. As a result, conversion control signal $\phi 21$ maintains a high level and signal $\phi 22$ maintains a low level.

Conversion buffer 80 shown in FIG. 1 receives a conversion control signal $\phi 21$ at a high level and a signal $\phi 22$ at a low level, and operates as follows. NOR gates 81 and 84 are disabled in response to a signal $\phi 22$ at a low level. On the other hand, NOR gates 82 and 83 are disabled in response to a signal $\phi 21$ of a high level. NOR gates 82 and 83, therefore, transmits respectively applied input signals. Externally applied /LCAS is output as an internal signal /LCAS through NOR gates 82 and 85. An externally applied signal /UCAS is output as an internal signal /UCAS through inverters 89 and 91.

An externally applied signal /WE is output as an internal signal /LWE through inverters 90 and 92. An NOR gate 87 outputs a signal CAC for column address control. An NOR gate 88 outputs an internal signal /CWE to be commonly used. Internal control clock signals /UCAS, /LCAS, /WE and /CWE generated from conversion buffer 80 are applied to clock generator 50 shown in FIG. 3, and clock generator 50 controls input-/output buffers 61 through 64 so that this DRAM 300 operates as a 2CAS/1WE type.

Figure 7:
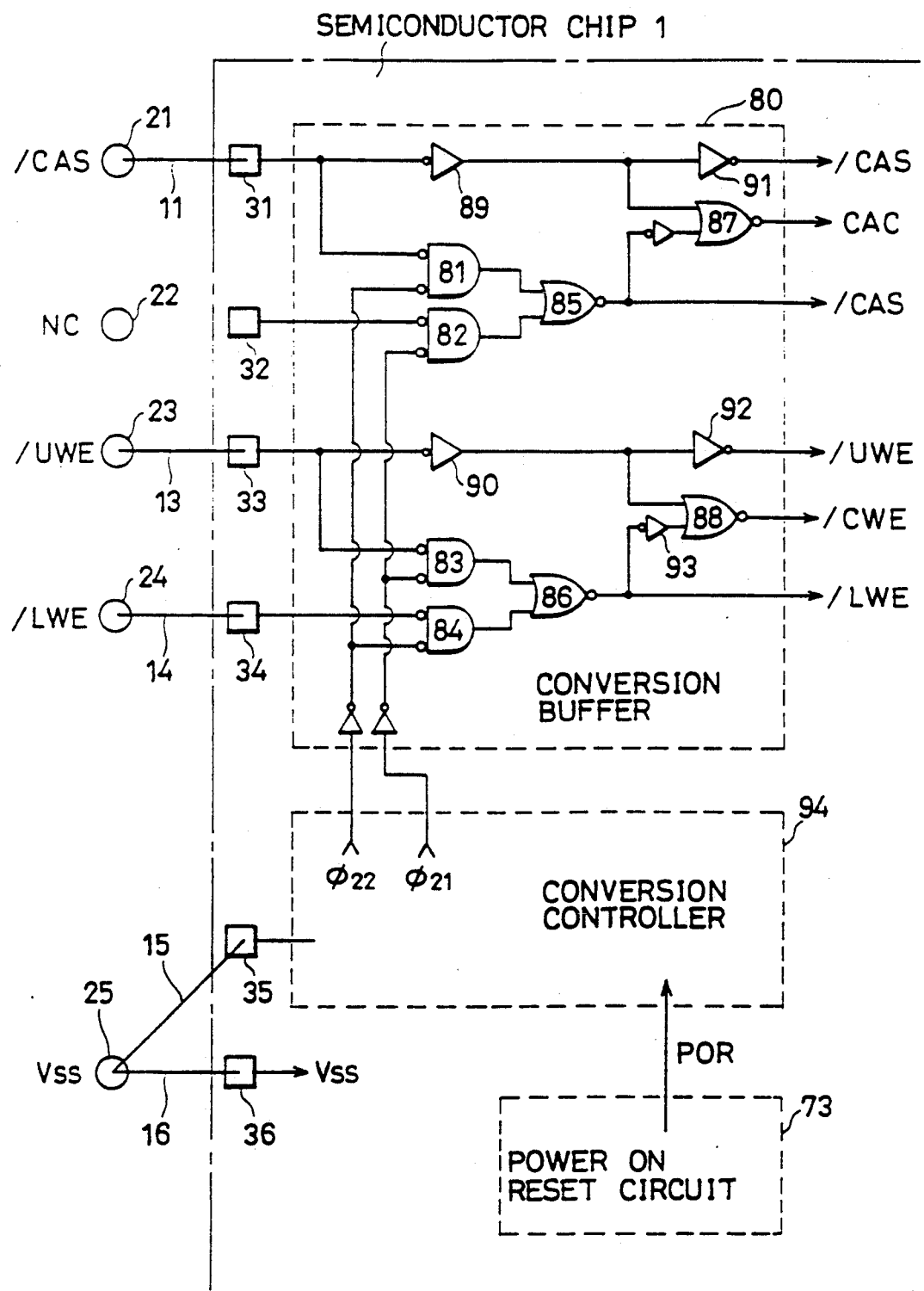
FIG. 7 is a circuit diagram showing another embodiment of the conversion buffer shown in FIG. 1.

FIG. 7 is a circuit diagram showing interconnections in a case where DRAM 300 shown in FIG. 2 is used as a 1CAS/2WE type. Referring to FIG. 7, leads for external control signal inputs 21, 23 and 24 are connected to bonding pads 31, 33 and 34 through gold wires 11, 13 and 14, respectively. In addition, bonding pad 35 is connected to a lead for ground potential input 25 through a gold wire 15.

Figure 6:
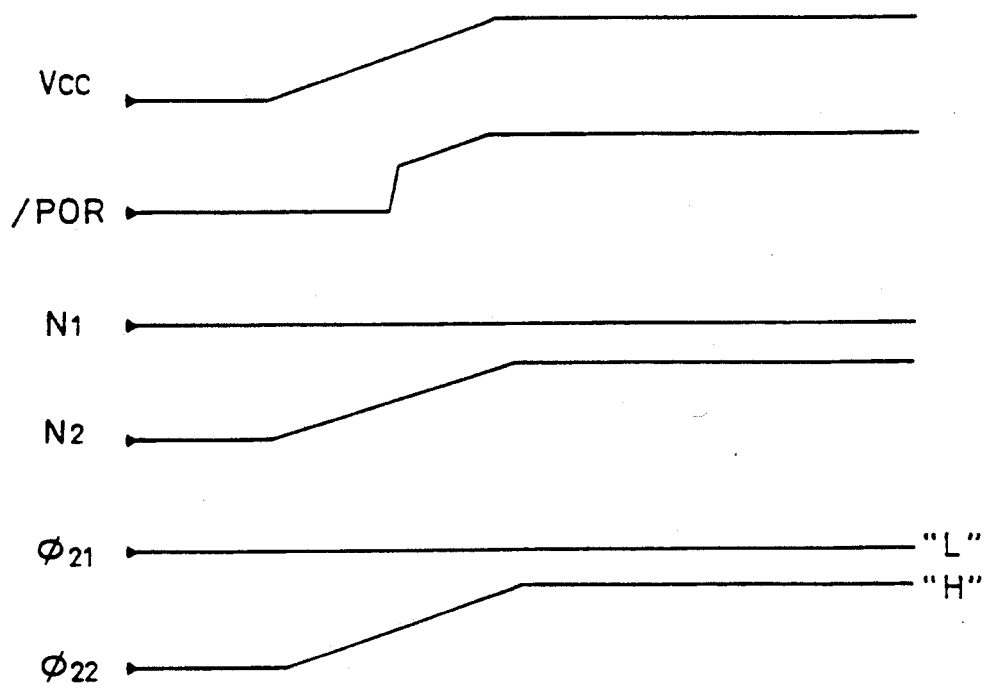
FIG. 6 is a timing chart showing another operation of the conversion controller shown in FIG. 4.

FIG. 6 is a timing chart showing the operation of conversion controller 94 shown in FIG. 4 in a case where DRAM 300 shown in FIG. 2 is used as a 1CAS/2WE type. In this case, bonding pad 35 is connected to a lead for ground potential 25 through a gold wire. Therefore, transistor 95 is turned on in a time period between a time t1 and at time t2. Since transistor 95 has small current driving capability, node N1 is held at a low level. Therefore node N2 is held at the high level, so that conversion control signal $\phi 21$ of a low level and conversion control signal $\phi 22$ of a high level are output.

Accordingly, in this case, while NOR gates 81 and 84 shown in FIG. 7 are enabled, NOR gates 82 and 83 are disabled. As a result, externally applied signals /CAS, /UWE and /LWE are converted by conversion buffer 80 to internal control clock signals /CAS, /UWE and /LWE effective to clock generator 50.

Figure 8:
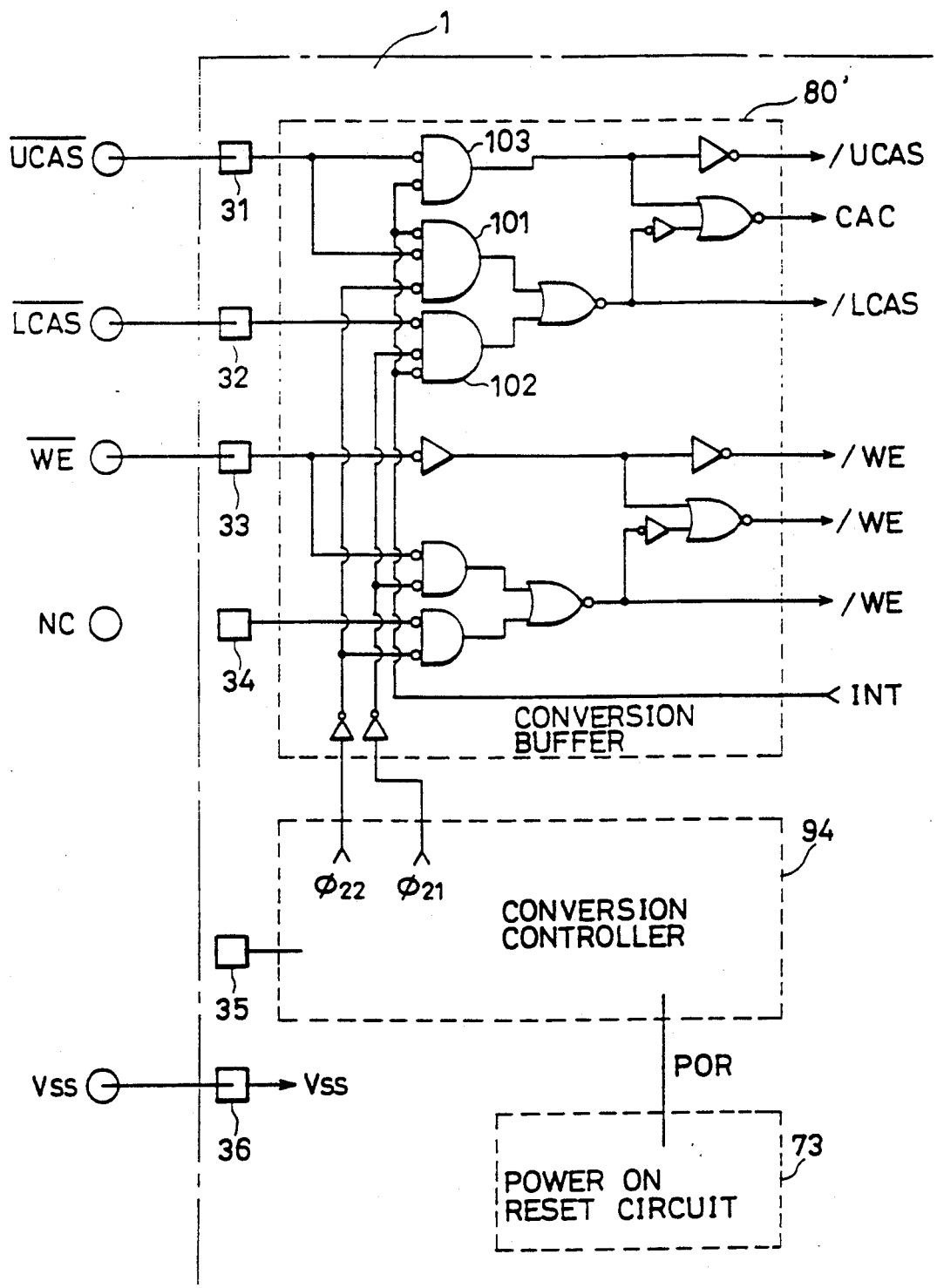
FIG. 8 is a circuit diagram showing yet another embodiment of the conversion buffer shown in FIG. 1.
Figure 9:
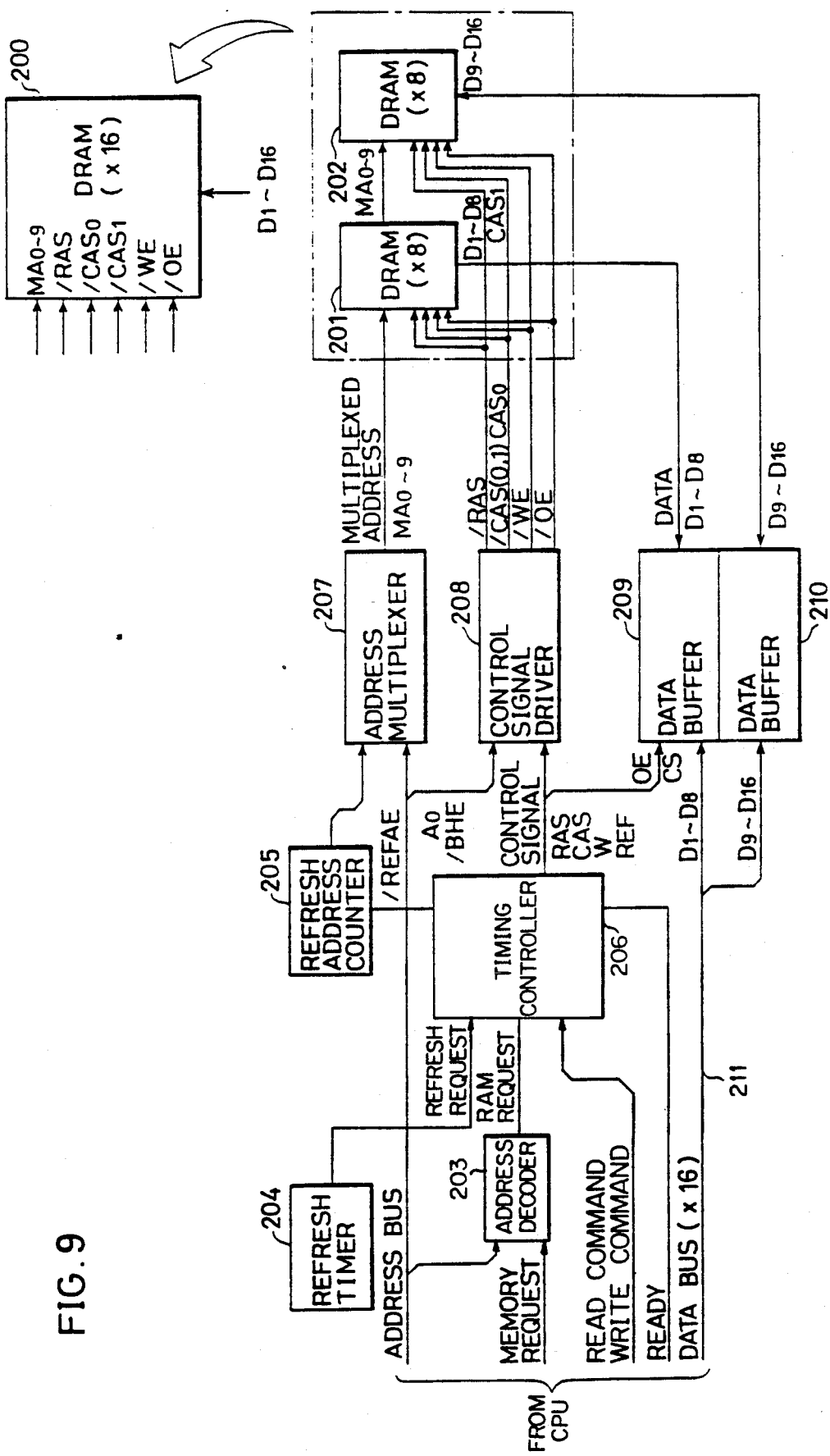
FIG. 9 is a block diagram of a memory system used in a personal computer.
Figure 10:
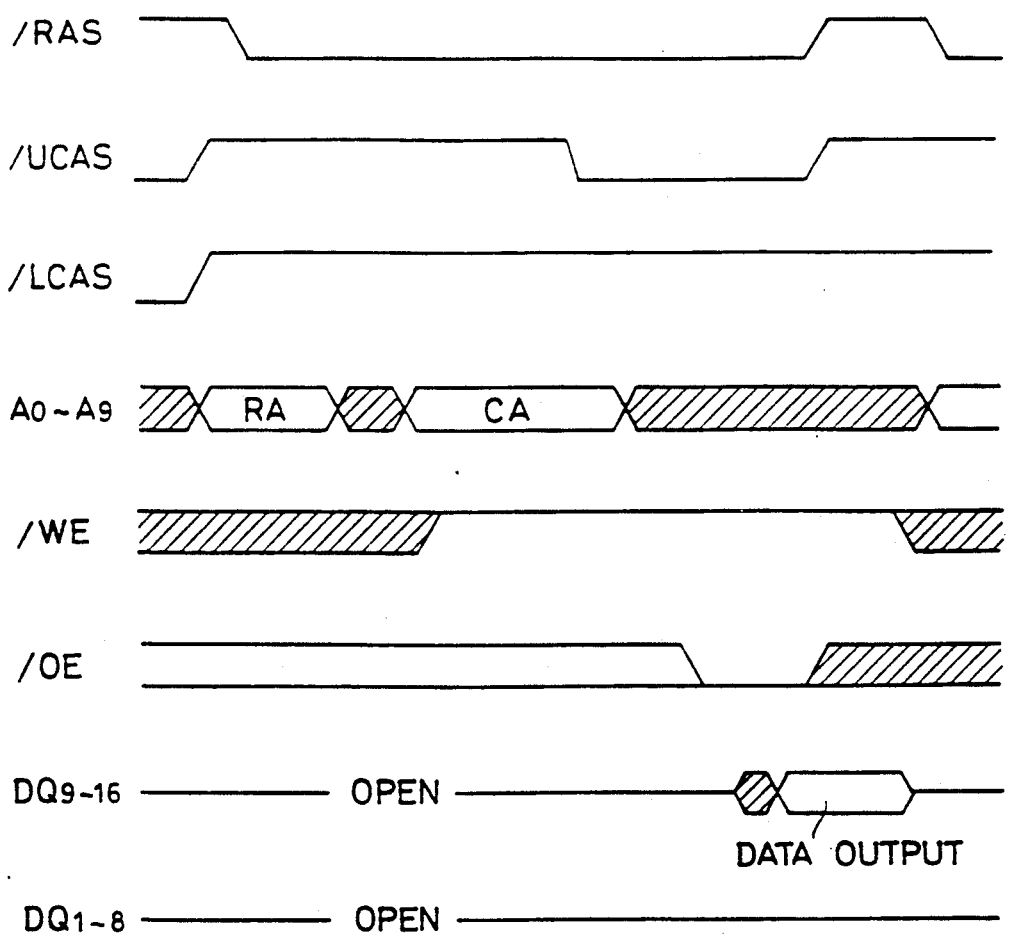
FIG. 10 is a timing chart in a higher byte read cycle of a DRAM of a 2CAS/1WE type.
Figure 11:
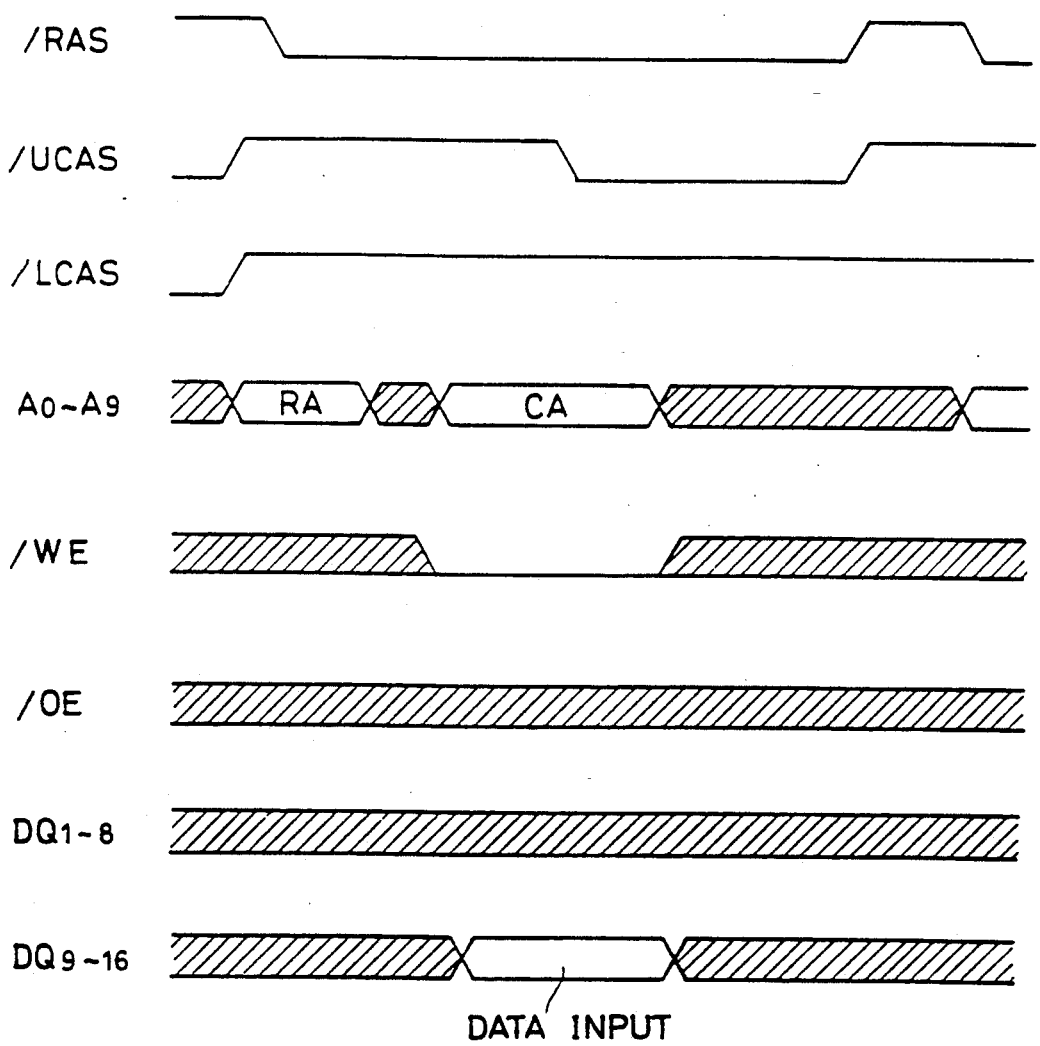
FIG. 11 is a timing chart in a higher byte write cycle of the DRAM of a 2CAS/1WE type.
Figure 12:
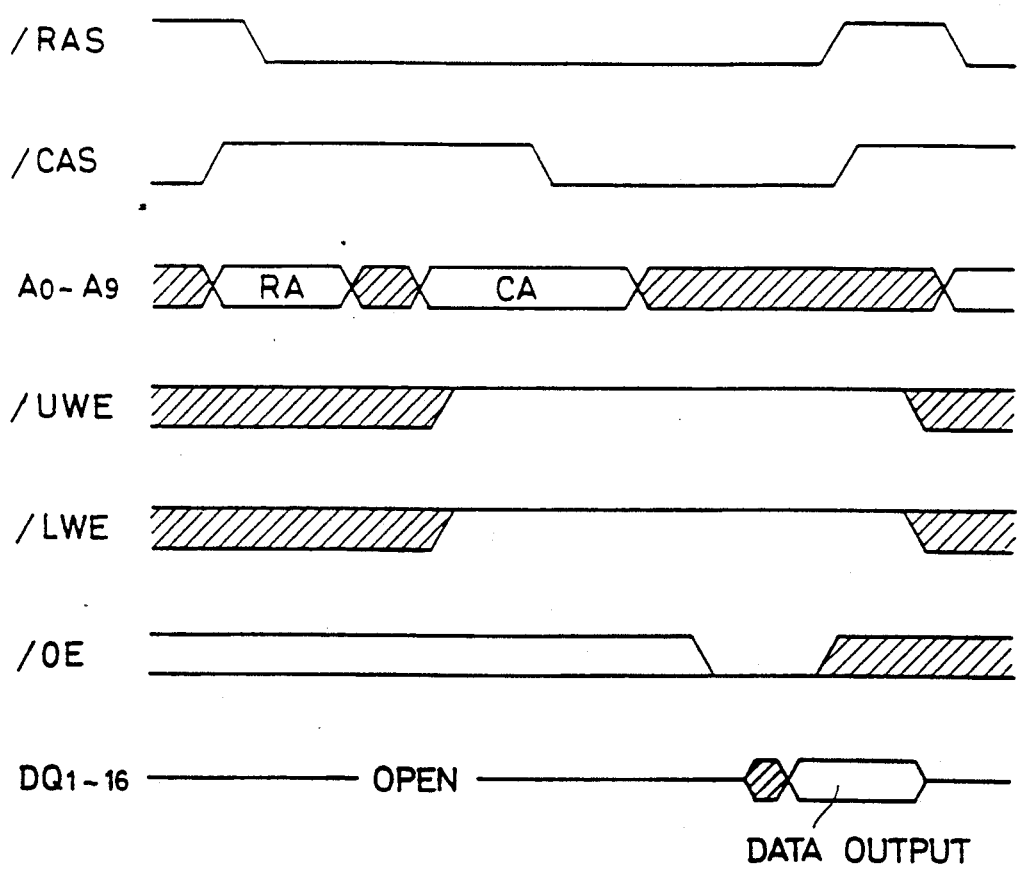
FIG. 12 is a timing chart of a read cycle of a DRAM of a 1CAS/2WE type.
Figure 13:
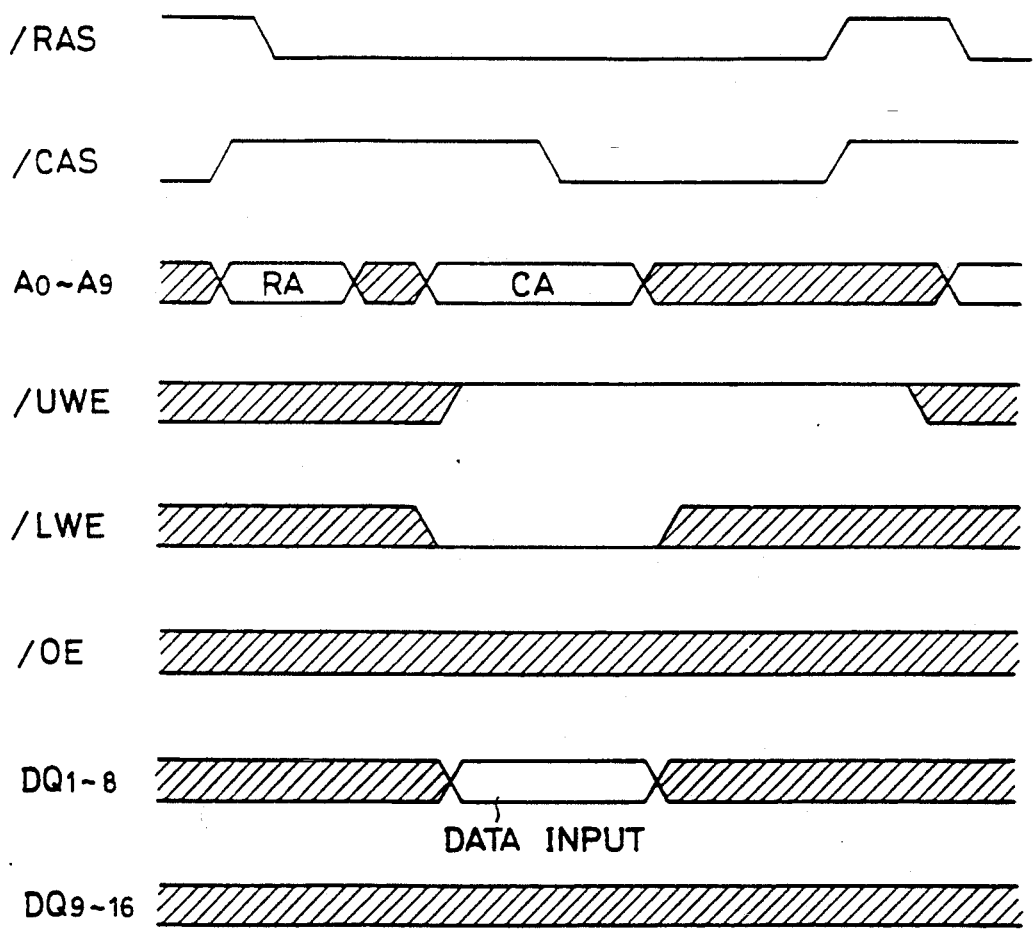
FIG. 13 is a timing chart in a lower byte write cycle of the DRAM of a 1CAS/2WE type.
Figure 14:
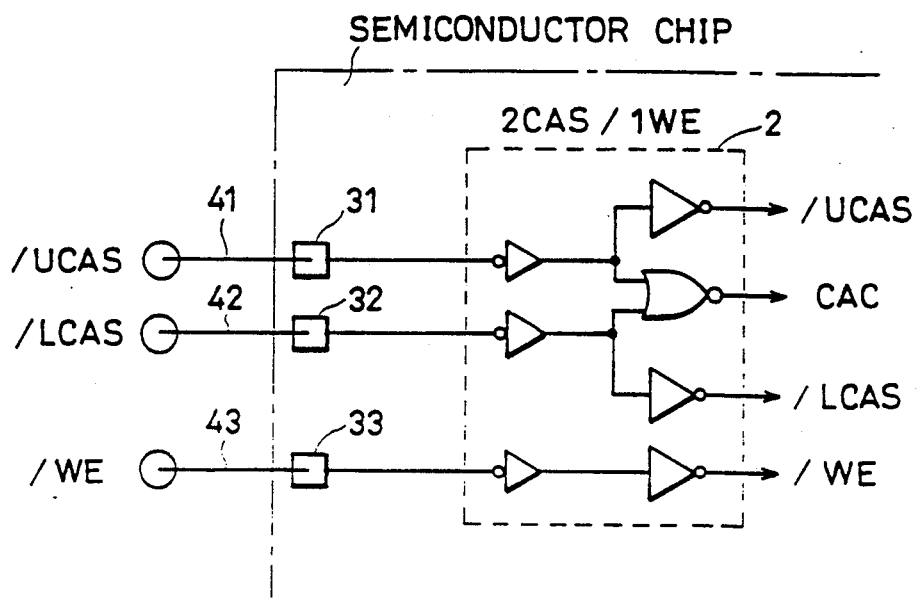
FIG. 14 is a circuit diagram of a conventional input buffer circuit for the DRAM of a 2CAS/1WE type.
Figure 15:
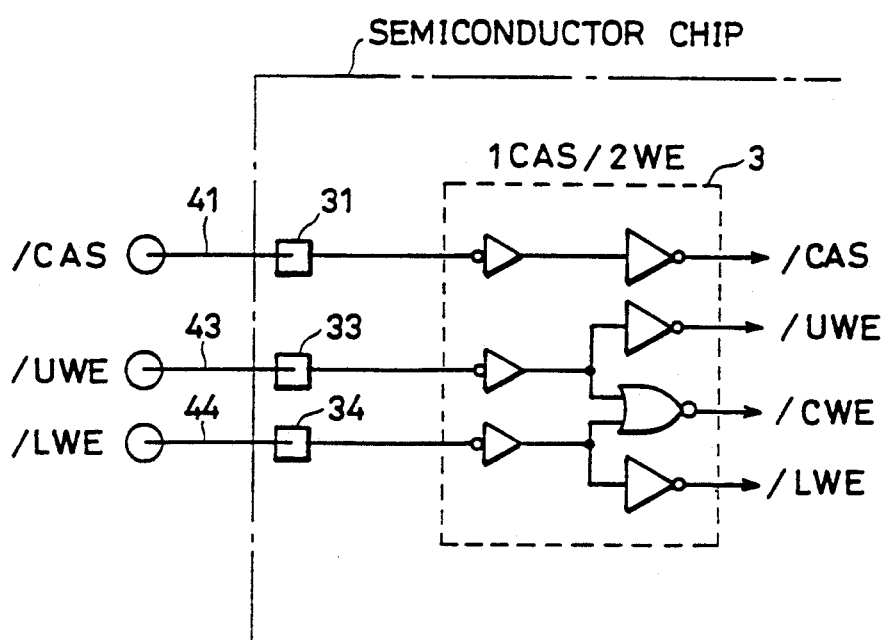
FIG. 15 is a circuit diagram of a conventional input buffer circuit for the DRAM of a 1CAS/2WE type.

In the circuits shown in FIGS. 1 and 7, a control signal for interlock is not shown at all, but in practice, a control signal for interlock should to be applied to conversion buffer 80 due to various requirements in a circuit configuration. FIG. 8 shows a conversion buffer 80' by way of an example where a control signal INT for interlock is applied. Referring to FIG. 8, NOR gates 101, 102 and 103 are provided in place of NOR gates 81 and 82 and inverter 89 shown in FIG. 1. These NOR gates 101, 102 and 103 are controlled in response to interlock control signal INT.

As described above, by providing conversion circuit 70 comprising conversion buffer 80 shown in FIG. 1 and conversion controller 94 shown in FIG. 4 within DRAM 300 shown in FIG. 2, the DRAM 300 is usable as either a 2CAS/1WE type or a 1CAS/2WE type. That is to say, by connecting gold wires 11, 12, 13 and 16 as shown in FIG. 1, DRAM 300 shown in FIG. 2 can be used as a 2CAS/1WE type. By connecting gold wires 11, 13 and 15 as shown in FIG. 7, DRAM 300 can be used as a 1CAS/2WE type. A usable type of DRAM can be determined at the final stage in a manufacturing process, so that a type of DRAM can be altered quickly depending on a drastically changing demand for DRAMs.

In addition, there is no need to provide two kinds of production lines each comprising almost the same production process in a semiconductor manufacturing factory, because DRAM 300 shown in FIG. 2 can be manufactured in one manufacturing process. Therefore, the efficiency in design, production and test for DRAM can be enhanced.

Although the above description is made of a case where this invention is applied to a DRAM having a 16-bit configuration above, it should be understood that this invention can be also applied to a DRAM having a configuration of 32 bits or more.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic random access memory device having a multibit configuration, said memory device being usable, depending on the requirements, as either a first read/write control type controlled by first and second column address strobe signals and a single write enable signal, or a second read/write control type controlled by a single column address signal and first and second write enable signals, comprising:
   a semiconductor substrate;
   receiving means for receiving at least three externally applied external control signals;
   a power supply input lead receiving externally supplied power supply voltage;
   a predetermined bonding pad formed on said substrate;
   signal conversion means formed on said substrate and responsive to the potential of said predetermined bonding pad for converting said at least three external control signals received by said receiving means to internal control signals for either said first or said second read/write control type; and
   clock signal generator means responsive to the internal control signals generated from said signal conversion means for generating first and second clock signals to operate said memory device as either said first or second read/write control type,
   the potential of said predetermined bonding pad being determined by whether there is a connection between said power supply input lead and said predetermined bonding pad.

2. The dynamic random access memory device according to claim 1, wherein said power supply input lead comprises a ground potential input lead receiving an externally applied ground potential.

3. The dynamic random access memory device according to claim 1, wherein said connection between said power supply input lead and said predetermined bonding pad is achieved through a gold wire.

4. The dynamic random access memory device according to claim 1, further comprising data configuration control means responsive to the clock signals generated from said clock signal generator means for controlling a configuration of data input/output to/from said memory device.

5. The dynamic random access memory device according to claim 4, further comprising:
   data input/output lead for inputting/outputting data having said multibit configuration; wherein
   said data configuration controlling means comprises data input/output buffer means connected to said data input/output lead and operated in response to the clock signals generated from said clock signal generator means.

6. The dynamic random access memory device according to claim 5, wherein
   said data input/output lead comprises:

a higher data input/output lead for higher byte data, and
a lower data input/output lead for lower byte data; and said data input/output buffer means comprises:
a higher data input/output buffer connected to said higher data input/output lead and operated in response to the clock signals generated from said clock signal generator means, and
a lower data input/output buffer connected to said lower data input/output lead and operated in response to the clock signal generated from said clock signal generator means.

* * * * *